(12) United States Patent
Fuller

(10) Patent No.: US 11,126,500 B2
(45) Date of Patent: Sep. 21, 2021

(54) ERROR DETECTION AND CORRECTION WITH INTEGRITY CHECKING

(71) Applicant: Microsoft Technology Licensing, LLC, Redmond, WA (US)

(72) Inventor: Jay S. Fuller, Scotts Valley, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 161 days.

(21) Appl. No.: 16/422,495

(22) Filed: May 24, 2019

(65) Prior Publication Data

US 2020/0371872 A1 Nov. 26, 2020

(51) Int. Cl.
*G06F 11/10* (2006.01)
*H03M 13/29* (2006.01)
*G11C 29/52* (2006.01)

(52) U.S. Cl.
CPC .......... *G06F 11/1068* (2013.01); *G11C 29/52* (2013.01); *H03M 13/2906* (2013.01)

(58) Field of Classification Search
None
See application file for complete search history.

(56) References Cited

U.S. PATENT DOCUMENTS

| | | | |
|---|---|---|---|
| 4,168,486 A | 9/1979 | Legory | |
| 5,761,221 A | 6/1998 | Baat et al. | |
| 7,624,329 B2 | 11/2009 | Syzdek et al. | |
| 8,082,482 B2* | 12/2011 | Gower | G06F 11/1008 714/763 |
| 8,631,308 B2* | 1/2014 | Goessel | H03M 13/6575 714/785 |
| 9,542,261 B2* | 1/2017 | Pepper | H03M 13/091 |
| 9,654,148 B2* | 5/2017 | Zhao | H03M 13/356 |

OTHER PUBLICATIONS

Noha, Frank, "ECC Handling in TMSx70-Based Microcontrollers", In Technical Report SPNA 126, Feb. 2011, 21 Pages.
"International Search Report and Written Opinion Issued in US Patent Application No. PCT/US20/028383", dated Aug. 14, 2020, 12 Pages.
Saileshwar et al., "SYNERGY: Rethinking Secure-Memory Design for Error-Correcting Memories", In Proceedings of IEEE International Symposium on High Performance Computer Architecture, Feb. 24, 2018, pp. 454-465.

* cited by examiner

*Primary Examiner* — Phung M Chung
(74) *Attorney, Agent, or Firm* — Ranjeev Singh; Singh Law, PLLC

(57) ABSTRACT

Systems and methods for error detection and correction with integrity checking are provided. A method includes first processing both data vector bit values and integrity vector bit values using a single error correction and double error detection (SECDED) code to generate check bit values, where the SECDED code is configured to allow both: (1) a detection and correction of a single error in the data vector values, or (2) an indication of an uncorrectable error, where the uncorrectable error corresponds to more than a single error in the data vector bit values or a single error or a multi-bit error in the integrity vector bit values. The method further includes second processing the check bit values and indicating an uncorrectable error for more than a single error in the data vector bit values or for a single error or a multi-bit error in the integrity vector bit values.

20 Claims, 8 Drawing Sheets

| BITS 202 | CHECK BITS 204 | | | | | | | | HAMMING WEIGHT 206 |
|---|---|---|---|---|---|---|---|---|---|
| | 7 | 6 | 5 | 4 | 3 | 2 | 1 | 0 | |
| 0 | 1 | | | 1 | 1 | 1 | | 1 | 5 |
| 1 | | 1 | 1 | 1 | 1 | | | 1 | 5 |
| 2 | 1 | | 1 | 1 | | 1 | | 1 | 5 |
| 3 | 1 | 1 | | 1 | | 1 | 1 | | 5 |
| 4 | 1 | 1 | | | 1 | 1 | 1 | | 5 |
| 5 | 1 | | 1 | 1 | 1 | | | 1 | 5 |
| 6 | 1 | | | | 1 | 1 | 1 | 1 | 5 |
| 7 | 1 | | | 1 | 1 | | 1 | 1 | 5 |
| 8 | | 1 | 1 | 1 | | 1 | 1 | | 5 |
| 9 | 1 | | | | 1 | 1 | 1 | 1 | 5 |
| 10 | 1 | | 1 | | | 1 | 1 | 1 | 5 |
| 11 | 1 | | 1 | 1 | | 1 | 1 | | 5 |
| 12 | | 1 | 1 | | | 1 | 1 | 1 | 5 |
| 13 | 1 | | 1 | | 1 | | 1 | 1 | 5 |
| 14 | 1 | 1 | | 1 | 1 | | | 1 | 5 |
| 15 | 1 | | 1 | | 1 | 1 | 1 | | 5 |
| 16 | | 1 | 1 | 1 | | 1 | | 1 | 5 |
| 17 | | 1 | 1 | 1 | 1 | 1 | | | 5 |
| 18 | 1 | | 1 | | 1 | 1 | | 1 | 5 |
| 19 | | 1 | | 1 | | 1 | 1 | 1 | 5 |
| 20 | | 1 | | | 1 | 1 | 1 | 1 | 5 |
| 21 | | 1 | | 1 | 1 | 1 | 1 | | 5 |
| 22 | 1 | | 1 | 1 | | | 1 | 1 | 5 |
| 23 | | 1 | 1 | 1 | | | 1 | 1 | 5 |
| 24 | | 1 | 1 | | 1 | | 1 | 1 | 5 |
| 25 | | 1 | 1 | | 1 | 1 | 1 | | 5 |
| 26 | | 1 | 1 | 1 | 1 | | 1 | | 5 |
| 27 | 1 | 1 | | 1 | 1 | 1 | | | 5 |
| 28 | 1 | 1 | 1 | 1 | | | | 1 | 5 |
| 29 | 1 | 1 | 1 | 1 | | 1 | | | 5 |
| 30 | 1 | 1 | 1 | | 1 | | | 1 | 5 |
| 31 | 1 | 1 | | | | 1 | 1 | 1 | 5 |
| SUM | 20 | 20 | 20 | 20 | 20 | 20 | 20 | 20 | |

*FIG. 2A*

| BITS 252 | CHECK BITS 254 | | | | | | | | HAMMING WEIGHT 256 |
|---|---|---|---|---|---|---|---|---|---|
| | 7 | 6 | 5 | 4 | 3 | 2 | 1 | 0 | |
| iv0  |   |   |   | 1 | 1 | 1 |   | 1 | 4 |
| iv1  | 1 | 1 |   | 1 |   |   | 1 |   | 4 |
| iv2  |   |   | 1 |   | 1 | 1 |   | 1 | 4 |
| iv3  | 1 | 1 |   |   |   |   | 1 | 1 | 4 |
| iv4  |   |   | 1 | 1 | 1 |   |   | 1 | 4 |
| iv5  | 1 |   | 1 |   |   | 1 | 1 |   | 4 |
| iv6  |   | 1 |   | 1 | 1 | 1 |   |   | 4 |
| iv7  |   | 1 | 1 |   |   |   | 1 | 1 | 4 |
| iv8  | 1 |   | 1 | 1 |   |   | 1 |   | 4 |
| iv9  | 1 | 1 |   |   | 1 | 1 |   |   | 4 |
| iv10 |   |   | 1 | 1 |   | 1 | 1 |   | 4 |

ERROR DETECTION AND CORRECTION WITH INTEGRITY CHECKING

BACKGROUND

Increasingly, malicious hackers are attempting to access data, such as security keys and other sensitive data. These attempts are not limited to the use of malicious code; instead, they include physical tampering with the integrated circuits or other such components, including memories. Also, with the increasing frequencies of data transmission channels, error detection and correction becomes increasingly important.

SUMMARY

In one example, the present disclosure relates to a method including first processing both data vector bit values and integrity vector bit values using a single error correction and double error detection code to generate check bit values, where the single error correction and double error detection code is configured to allow both: (1) a detection and correction of a single error in the data vector values, or (2) an indication of an uncorrectable error, where the uncorrectable error corresponds to more than a single error in the data vector bit values or a single error or a multi-bit error in the integrity vector bit values. The method may further include second processing the check bit values and indicating an uncorrectable error for more than a single error in the data vector bit values or for a single error or a multi-bit error in the integrity vector bit values.

In another example, the present disclosure relates to a system including an encoder configured to process both data bit values corresponding to data and address bit values corresponding to an address using a single error correction and double error detection code to generate check bit values, where the single error correction and double error detection code is configured to allow both: (1) a detection and correction of a single error in the data bit values, or (2) an indication of an uncorrectable error, where the uncorrectable error corresponds to more than a single error in the data bit values or a single bit error or a multi-bit error in the address bit values. The system may further include a decoder configured to process the check bit values and indicate an uncorrectable error both: (1) for more than a single error in the data bit values, or (2) for a single error or a multi-bit error in the address bit values, despite detecting not even a single error in the data bit values.

In another example, the present disclosure relates to a method in a system comprising a memory configured to store data at an address. The method may include processing data bit values corresponding to the data and address bit values corresponding to the address of the data using a single error correction and double error detection code to generate encoded bit values, where the single error correction and double error detection code is configured to allow both: (1) a detection and correction of a single error in the data bit values, or (2) an indication of an uncorrectable error, where the uncorrectable error corresponds to more than a single error in the data bit values or a single error or a multi-bit error in the address bit values. The process may further include decoding the encoded bit values and indicating an uncorrectable error both: (1) for more than a single error in the data bit values, or (2) for a single error or a multi-bit error in the address bit values, despite detecting not even a single error in the data bit values.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIGS. 2A and 2B show tables illustrating the logic associated with encoder 140 of FIG. 1 in accordance with one example;

DETAILED DESCRIPTION

Examples described in this disclosure relate to error detection and correction with integrity checking. Certain examples are related to the use of an error correcting, error detecting and integrity checking code. In one example, this code may be an extension of odd Hamming weight Single Error Correction-Double Error Detection (SECDEC) codes. To correct a single bit error within a 32-bit word and detect any two bit errors within the 32-bit word SECDEC code with an additional 7 bits of redundant, parity type information may be required. The examples in this disclosure include systems and methods related to a code for a 32-bit word that provides a single bit correction, double error bit detection, and performs integrity checking on a separate field (e.g., an 11 bit integrity vector or an 11 bit address). For a 32-bit word, one example includes the use of eight additional bits for correcting a single bit error, detecting a double bit error, and performing an integrity check. While seven bits of additional parity bits are sufficient to achieve the single bit correction and the double bit error detection for a 32-bit word; by using eight additional parity bits, instead of 7, the described systems and methods can simultaneously perform integrity checking on a separate field. In other examples, 7 bits of redundant information may be sufficient to perform at least some amount of integrity checking. The integrity checking is implemented in a manner that any number of errors in the bits, including even a single error, associated with the integrity vector result in an uncorrectable error status. This may advantageously allow a system to detect potential interference with the bits associated with the integrity vector. As an example, when the integrity vector is an address for some data in a memory, a malicious fault which alters the address may be detected. Other examples may include detecting any errors injected into an identifier or other meta-data associated with a data item.

Figure 1:
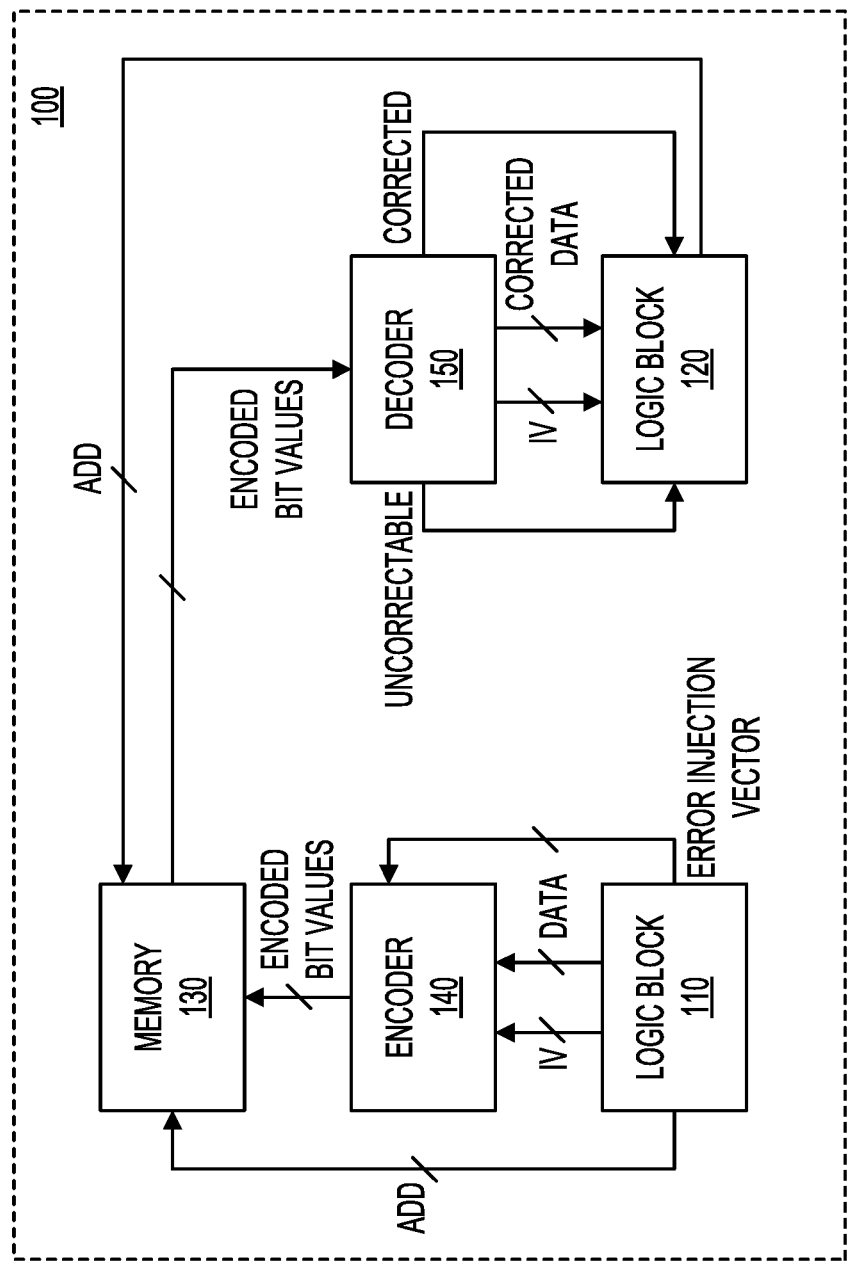
FIG. 1 shows a block diagram of a system including error correction and detection with integrity checking in accordance with one example.

FIG. 1 shows a block diagram of a system 100 including error correction and detection with integrity checking in accordance with one example. System 100 may be used with 32-bit memories, such as one-time programmable (OTP) memories that have limited reliability and can utilize the error correction for improved data reliability, or for applications that need error detection and can accommodate 8 extra bits of redundancy. System 100 may also be useful in other applications where the channel error rate of a multi-bit transaction may need improvement. System 100 may include a logic block 110, another logic block 120, a memory 130, an encoder 140, and a decoder 150. Logic block 110 may correspond to any logic configured to provide an address (ADD) and data (DATA) to be written to memory 130 at the address specified by logic block 110. Logic block 110 may also be configured to provide an integrity vector (e.g., an 11-bit IV) and an error injection vector (e.g., a 32-bit or 40-bit ERROR INJECTION VECTOR). The integrity vector may include information such as one or more of secure keys, secret keys, device IDs, initiator IDs, part IDs, serial numbers, code, analog trimming and calibration information, sensor trimming and calibration information, or any other type of information, whose integrity may be important in a particular context. The data's address could be tied to the integrity vector so that any move attacks or other address faults are automatically detected. An address space of 2K words, 8K bytes, or 64K bits can be supported with the 11 bits of integrity vector. If it is desirable to protect a large number of address bits a hash function can be used to represent the larger number of address bits or the integrity vector bits. The error injection capabilities of encoder 140 may facilitate these modules to be fully fault tested in the application design. The error injection capability may also make encoder 140 a useful component in verification environments removing the necessity of a separate behavioral model to facilitate error injection for verification and also device testing.

Still referring to FIG. 1, logic block 120 may correspond to any logic configured to provide an address (ADD) for reading data (DATA) from memory 130. The address information may be used to select a memory location on memory 130. The number and organization of address terminals and core banks may depend on the memory type, the memory's size and organization. In one example, memory 130 may be a one-time-programmable (OTP) memory. The OTP memory may be formed using any of a number of technologies, including floating-gate technology, electric-fuse technology, or anti-fuse technology. Floating-gate technology may correspond to trapping the charge for programming the memory and depleting the chart for erasing the programmed bits. Electric-fuse based technology may include subjecting metal or polysilicon to high-voltages, causing electromigration. Anti-fuse based technology may include gates with oxides that have been subjected to breakdown. Although logic block 110 and logic block 120 are shown as separate blocks, they may be combined. In addition, logic block 110 may be configured to provide information other than an address to memory 130. As an example, logic block 110, or another logic block, processor, or another controller, may provide information referred to as an integrity vector.

With continued reference to FIG. 1, in one example, encoder 140 may have an input for a 32-bit data bus and may produce a 40-bit data word (e.g., ENCODED BIT VALUES) with sufficient redundancy to correct any 1-bit data error. Decoder 150 may take a 40-bit input (e.g., ENCODED BIT VALUES) and may produce a 32-bit output (e.g., CORRECTED DATA) while correcting any single bit error and may also be capable of detecting all 2-bit errors, and some other multi-bit errors. The encoding functionality of system 100 may be designed so that all zero and all one patterns are flagged as uncorrectable. Decoder 150 may receive the 40-bits corresponding to the ENCODED BIT VALUES and the integrity vector (e.g., IV) or the address. If the integrity vector provided to decoder 150 does not match the same value that was provided to encoder 140, an uncorrectable error will be signaled when two errors are detected (e.g., via the signal labeled UNCORRECTABLE). Decoder 150 may also provide a CORRECTED signal to logic block 120 indicating that a single bit error was corrected. In this example, the same integrity vector value (e.g., IV) is presented to decoder 150 that was used to encode the data for proper data decoding. If no integrity vector information is available, IV may be assigned 11 constant (e.g., zero) bits at both the encoder and decoder.

Memory 130 may be any type of memory, including either non-volatile memory or volatile memory. Non-volatile memory may include flash memory, EEPROM, or other types of non-volatile memories. Volatile memory may include dynamic random access memory (DRAM), static random access memory (SRAM), or other types of volatile memories. Although FIG. 1 shows a certain number of components of system 100 arranged in a certain manner, there could be more or fewer number of components arranged differently. As an example, although the encoder and decoder are shown as unpipelined designs that are combinatorial modules with no clocks or resets, pipeline register(s) may be included. As an example, automatic pipeline insertion/retiming tools can be used if extremely high frequency operation is required.

FIGS. 2A and 2B show a table 200 and a table 250 illustrating the logic associated with encoder 140 of FIG. 1 in accordance with one example. Table 200, shown in FIG. 2A, includes three columns, including BITS 202, CHECK BITS 204, and HAMMING WEIGHT 206. The rows by the numbers from 0 to 31 correspond to the 32 bits of DATA. CHECK BITS 204 for the data bits correspond to eight-bit codes, where each of one of the eight-bit codes has a Hamming weight of 5, as shown in HAMMING WEIGHT 206. In this example, the Hamming weight of 5 is selected because it is close to one half of 8 and it is an odd number. Alternatively, in another example, the Hamming weight of 3 may also be used. Indeed, the Hamming weight may equal any odd number of check bits; thus, for an eight-bit check code, the Hamming weight may be 1, 3, 5, or 7. With respect to the codes with the Hamming weight of 5, there are 55 such codes. In this example, 32 out of the 55 codes are selected such that the sum of the Hamming weights at each bit position is the same. Thus, in this example, the sum of the Hamming weights (in the row labeled SUM) for each position is 20. While it is not necessary for the sum of the 1s in each column (corresponding to a respective bit position) to be equal, selection of those codes that have the same weight may advantageously balance the complexity of the hardware required to process the data and the check bits.

With reference to FIG. 2B, the rows identified by the labels iv0 to iv10 (in the column labeled BITS 252) correspond to the 11 bits of the address (ADD) or the integrity vector. In table 250, CHECK BITS 254 for the address or the integrity vector also correspond to eight-bit codes, where each one of the eight-bit codes has a Hamming weight of 4, as shown in HAMMING WEIGHT 256. An even Hamming weight was chosen for these codes so that a discrepancy would be flagged as an uncorrectable error. Indeed, the Hamming weight may equal any even number of check bits;

thus, for an eight-bit check code, the Hamming weight may be 2, 4, 6, or 8. In this example, eleven codes were chosen to match the 11 bit address (or an 11 bit integrity vector) on which the integrity check is performed on. Indeed, a different number of codes may be selected based on the size of the address or the integrity vector. In this example, if a different address is presented to decoder 150 of FIG. 1 than was used by the encoder 140 to encode the data, an uncorrectable error will be flagged. Thus, if any data corresponding to a specific address is moved within the memory, or if there is a fault on an address line, an uncorrectable error will be signaled. In this case, the eleven check codes were selected such that each one has a Hamming weight of 4, and the selected codes are those that resulted in a consistent Hamming sum across the 8 bits. The consistency of the weight amongst these codes again helps to balance the logic area and depth amongst the check bits. In this example, the eleven Hamming weight 4 codes are created by adding (XORing) pairs of unused Hamming weight 5 codes, which were unused from the previous set of 55 codes. If the error syndrome matches one of these 11 patterns the error would likely be due to the address line that matched that syndrome pattern being incorrect. In one example described in the present disclosure all uncorrectable faults are treated the same, so the uncorrectable errors are not further examined. Many more than 11 even Hamming weight codes exist for an 8-bit check bit code word. Indeed, more than 64 even Hamming weight codes exist.

With continued reference to FIGS. 2A and 2B, although tables 200 and 250 show certain information organized in a certain way, additional information may be included and organized differently. In addition, it is possible to use different odd Hamming weights for different data bits. Assuming one can store 8 bits of redundant parity information and one can use 55 patterns with a Hamming weight 5, 50 patterns with a Hamming weight 3, 8 patterns with a Hamming weight 1, and 8 patterns with a Hamming weight of 7, then, this would allow for correcting a single bit error in a 122-bit data word. Moreover, because there are more than 32 8-bit codes with a Hamming weight of 4, a 32-bit address bus could be integrity checked. Indeed, many even Hamming weight codes can be used to integrity check a large vector if needed.

Figure 3:
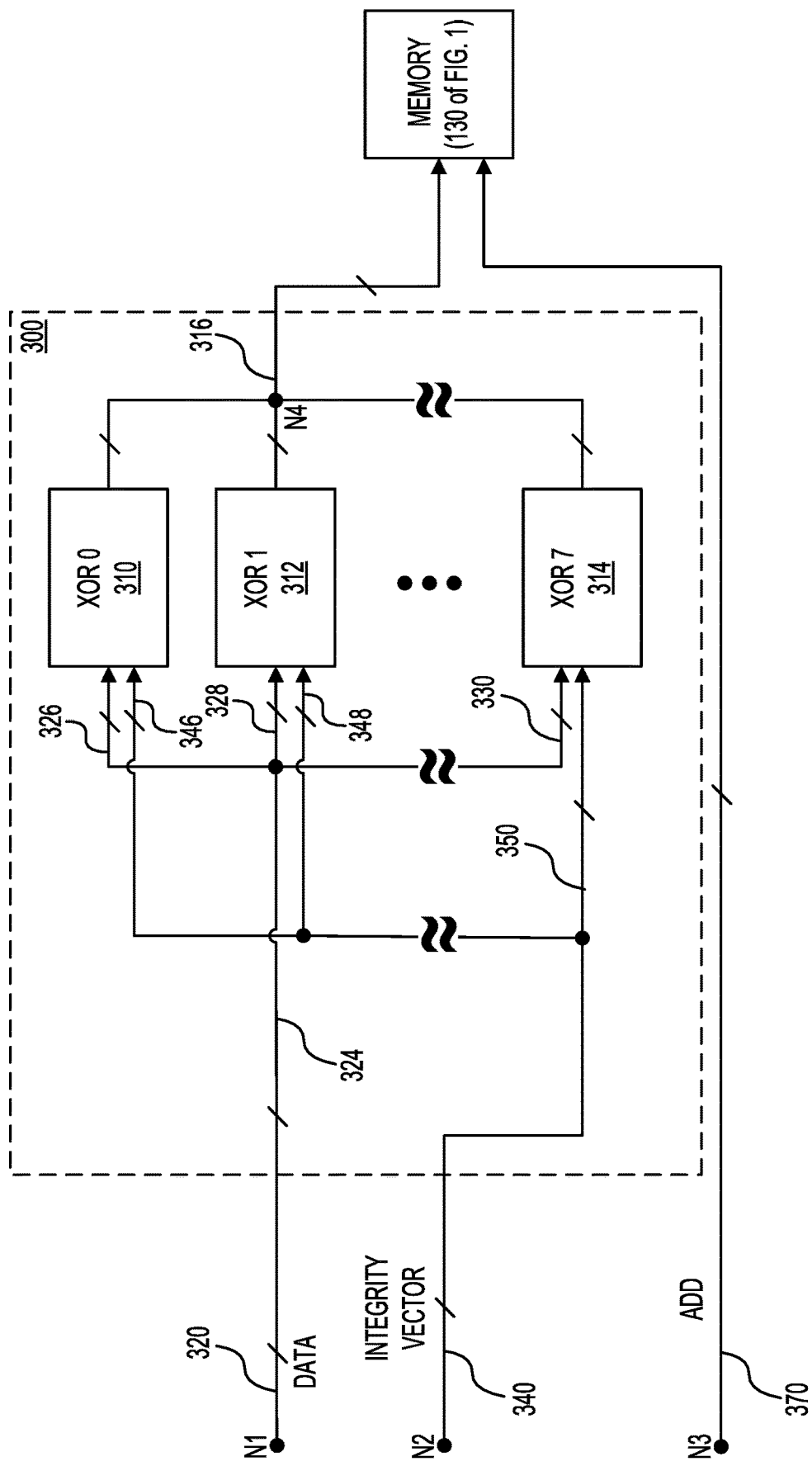
FIG. 3 shows a diagram of an encoder in accordance with one example.

FIG. 3 shows a diagram of an encoder 300 in accordance with one example. Encoder 140 of FIG. 1 may be implemented as encoder 300. Encoder 300 may include exclusive-OR (XOR) blocks corresponding to each bit of the eight bit Hamming code. Thus, in this example, in FIG. 3, encoder 300 is shown to include XOR 0 310, XOR 1 312, and XOR 7 314. While XOR 2, XOR 3, XOR 4, XOR 5, and XOR 6 are not shown, they will be included as part of encoder 300 such that there is an XOR logic block corresponding to each one of the eight bits. Indeed, if the number of check bits is different than there will be a different number of the XOR logic blocks. Bus 320 may be configured to receive data (e.g., DATA), via node N1, from another logic block or another portion of the circuitry. In this example, the bus 320 may be 32-bits wide because in this example the logic is configured to process a 32 bit word. Indeed, other data having a different bit width may also be processed. An integrity vector (e.g., INTEGRITY VECTOR) may be received at bus 340 via node N2. An address (e.g., ADD) may be received at bus 370 via node N3 and coupled to memory. In this example, each XOR block is configured to perform an exclusive OR on 20 bits for the data and 5 bits for the integrity vector, which may include the address bits.

With continued reference to FIG. 3, in this example, XOR 0 310 is configured to perform an exclusive OR operation on the 20 bits in the bit 0 position in table 200 and bit 0 position in table 250. Thus, in this example, XOR 0 310 is configured to perform an exclusive OR operation on the following 20 data bits: 0, 1, 2, 5, 6, 7, 10, 12, 13, 14, 16, 18, 19, 20, 22, 23, 24, 28, 30, and 31, as shown in table 200, and the following 5 address or integrity vector bits: iv0, iv2, iv3, iv4, and iv7, as shown in table 250. XOR 1 312 is configured to perform an exclusive OR operation on the following 20 data bits: 3, 4, 6, 7, 8, 9, 10, 11, 12, 13, 15, 19, 20, 21, 22, 23, 24, 25, 26, and 31, as shown in table 200, and the following 5 address or integrity vector bits: iv1, iv3, iv5, iv7, iv8, and iv 10, as shown in table 250. XOR 7 314 is configured to perform an exclusive OR operation on the following 20 data bits: 0, 2, 3, 4, 5, 6, 7, 9, 10, 11, 13, 14, 15, 18, 22, 27, 28, 29, 30, and 31, as shown in table 200, and the following 5 address or integrity vector bits: iv1, iv3, iv5, iv8, and iv9, as shown in table 250. Other XOR logic blocks may also be configured to perform an exclusive OR operation on all of the bits in the corresponding column that have a value of 1. Thus, another XOR logic block (not shown) may perform the exclusive OR operation on both data bits and integrity vector bits corresponding to those bits that have a value of 1 in the bit position 3 in table 200 and table 250, respectively. The output from each of the XOR logic blocks may be coupled to node N4, which may further be provided to memory 130 of FIG. 1 via bus 316 coupled between the node N4 and the node N5. Although FIG. 3 shows a certain number of components of encoder 300 arranged in a certain manner, there could be more or fewer number of components arranged differently. As an example, instead of performing the exclusive OR operation in parallel, the operation may be performed serially or using a tree structure including XOR logic blocks. In addition, although encoder 300 is shown as a combinatorial logic block, encoder 300 may be implemented using other types of logic, including logic that may require a clock to synchronize the operations.

Figure 4A:
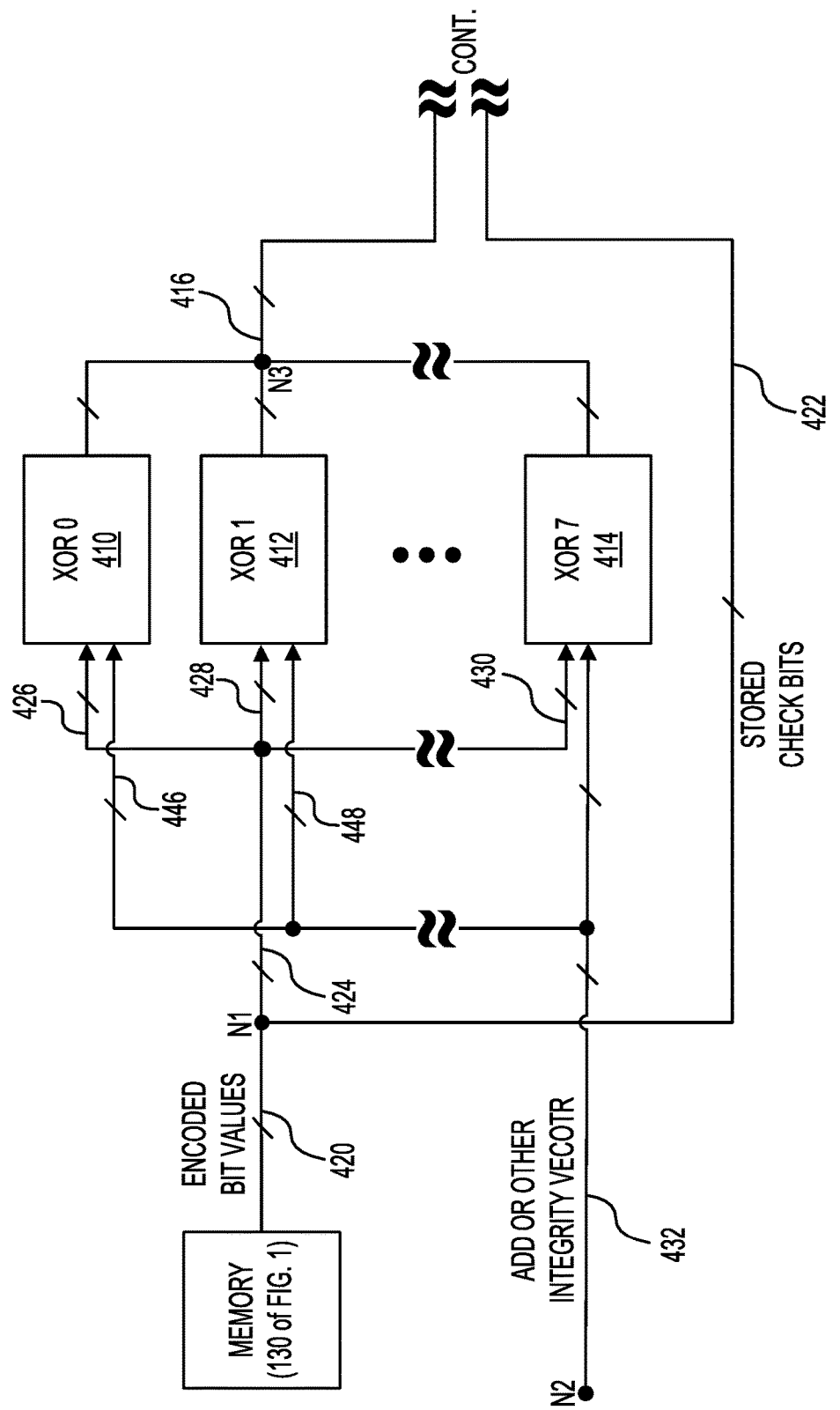
FIGS. 4A and 4B show a diagram of a decoder in accordance with one example.
Figure 4B:
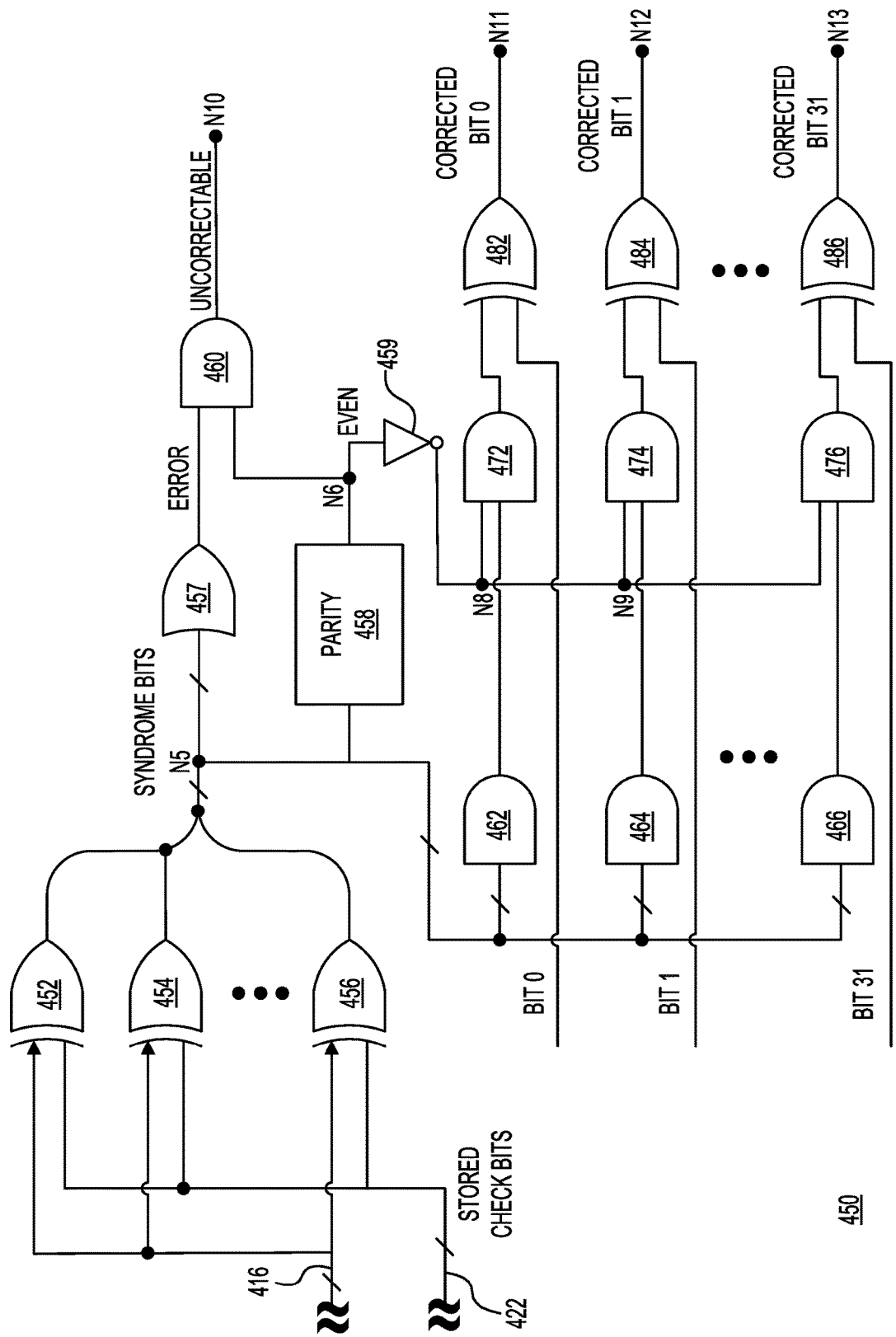

FIGS. 4A and 4B show a decoder (e.g., decoder 150 of FIG. 1) in accordance with one example. The decoder uses the same logic to calculate the check bits, but the decoder uses the retrieved data instead of the data to be stored in the memory (e.g., memory 130). The decoder performs an exclusive OR operation on the newly calculated check bits with the stored parity bits. This results in the generation of the error syndrome. If the syndrome is zero, no error is detected; this is because the recalculated check bits match the stored bits. If the error syndrome has an odd parity, it's assumed there was a single bit correctable error. The specific bit with the error is the bit for which the syndrome matches the check bit code, so when the error syndrome has an odd parity the bit that matched the syndrome pattern is flipped to correct the single bit error. FIG. 4A shows portion 400 of the decoder, coupled to memory 130 of FIG. 1, including XOR logic blocks XOR 0 410, XOR 1 412, and XOR 7 414. memory 130 may provide encoded bit values via bus 420 to the decoder. In this example, bus 420 may be 40 bits wide such that it could carry 32 bits of data and 8 check bits. At node N1, 20 bits out of the 32 bits of data may be coupled to a respective XOR logic block and the 8 check bits may be transmitted via bus 422 to portion 450 (shown in FIG. 4B) of the decoder. The address or the integrity vector may be received at node N2, from where it may be coupled as an input to each of the XOR logic blocks, as shown in FIG. 4A. The output of the XOR logic blocks may be coupled to node N3, which may be coupled via bus 416 to the remaining portion of the decoder described with respect to FIG. 4B.

As shown in FIG. 4B, decoder portion 450 includes additional logic configured to perform an exclusive OR operation to generate the syndrome bits; to generate an uncorrectable error signal when there is more than a single error in the data vector bit values or there is a single error or multi-bit error in the integrity vector bit values; and to generate the corrected bits when there is only a single bit error in the data word. Thus, as shown in FIG. 4B, the exclusive OR operation may be performed on the generated check bits (e.g., received via bus 416 from the logic in FIG. 4A) and the stored check bits (e.g., the STORED CHECK BITS retrieved via bus 422 from memory 130). In this example, XOR gates 452, 454, and 456 may be configured to perform the aforesaid exclusive OR operation and provide syndrome bits (e.g., SYNDROME BITS at node N5). In this example, the SYNDROME BITS are coupled to an OR gate 457, whose output is coupled to one input of an AND gate 460. If the SYNDROME BITS are zero, then the generated check bits match the STORED CHECK BITS and it is assumed that there is no error in both the data vector bit values and the integrity vector bit values. The output of parity block 458 is provided to the second input of AND gate 460. If parity block 458 detects that the SYNDROME BITS have an even parity (e.g., EVEN), then the logical AND operation performed by AND gate 460, indicates an uncorrectable error (e.g., UNCORRECTABLE via node N10) as long as at least one bit of SYNDROME BITS is not zero. Also, if the integrity vector bit values given to the encoder and the decoder do not match, then that also results in the uncorrectable error.

With continued reference to FIG. 4B, the specific bit with the error is the bit for which the syndrome matches the check bit code, so when the error syndrome has an odd parity, the bit that matched the syndrome pattern is flipped to correct the single bit error. To allow for correction of the single bit errors, in this example, the logic shown in the bottom portion of FIG. 4B is used. Thus, the SYNDROME BITS are subjected to a logical AND operation using AND gates 462, 464, and 466. In this example, although not shown in FIG. 4B, for each bit (e.g., BIT 0, BIT 1, and BIT 31) a selected set of the SYNDROME BITS is inverted prior to being subjected to the logical AND operation. Thus, as an example, in view of the arrangement of the check bits in table 200 of FIG. 2, for BIT 0, SYNDROME BITS corresponding to bit positions bit position 1, 5, 6, 8, 9, and bit position 10 are inverted. The other SYNDROME BITS being subjected to the logical AND operation using AND gate 462 are not inverted. As another example, for BIT 1, SYNDROME BITS correspond to bit positions 0, 2, 4, 6, and bit position 9 are inverted. As yet another example, for BIT 31, SYNDROME BITS corresponding to bit positions 0, 2, 4, 6, 7, and bit position 10 are inverted. The output of these AND gates is supplied to another respective AND gate (e.g., AND gates 472, 474, and 476). The other input of the AND gates is an inverted value (e.g., inverted using inverter 459) of the EVEN parity, which is supplied via nodes N8 and N9, as shown in FIG. 4B. The output of each of these AND gates (e.g., AND gate 472, 474, and 476) is coupled as one of the inputs to a respective exclusive OR gate (e.g., one of exclusive OR gates 482, 484, and 486). The output of exclusive OR gate 482 corresponds to the CORRECTED BIT 0 and is provided via node N11. The output of exclusive OR gate 484 corresponds to the CORRECTED BIT 1 and is provided via node N12. The output of exclusive OR gate 486 corresponds to the CORRECTED BIT 31 and is provided via node N11. This example in FIG. 4B assumes a 32-bit data vector and thus although not shown there are 32 AND gates for receiving each of the bit values read from the memory (e.g., memory 130). Similarly, there are 32 AND gates for performing the AND operation between the parity bit and the output of the other set of AND gates. Moreover, although not shown, there are 32 exclusive OR gates for generating the corrected bit values corresponding to each of the 32 bits. Although FIGS. 4A and 4B show a certain number of components arranged in a certain fashion, the decoder may include additional or fewer components arranged differently.

Figure 5:
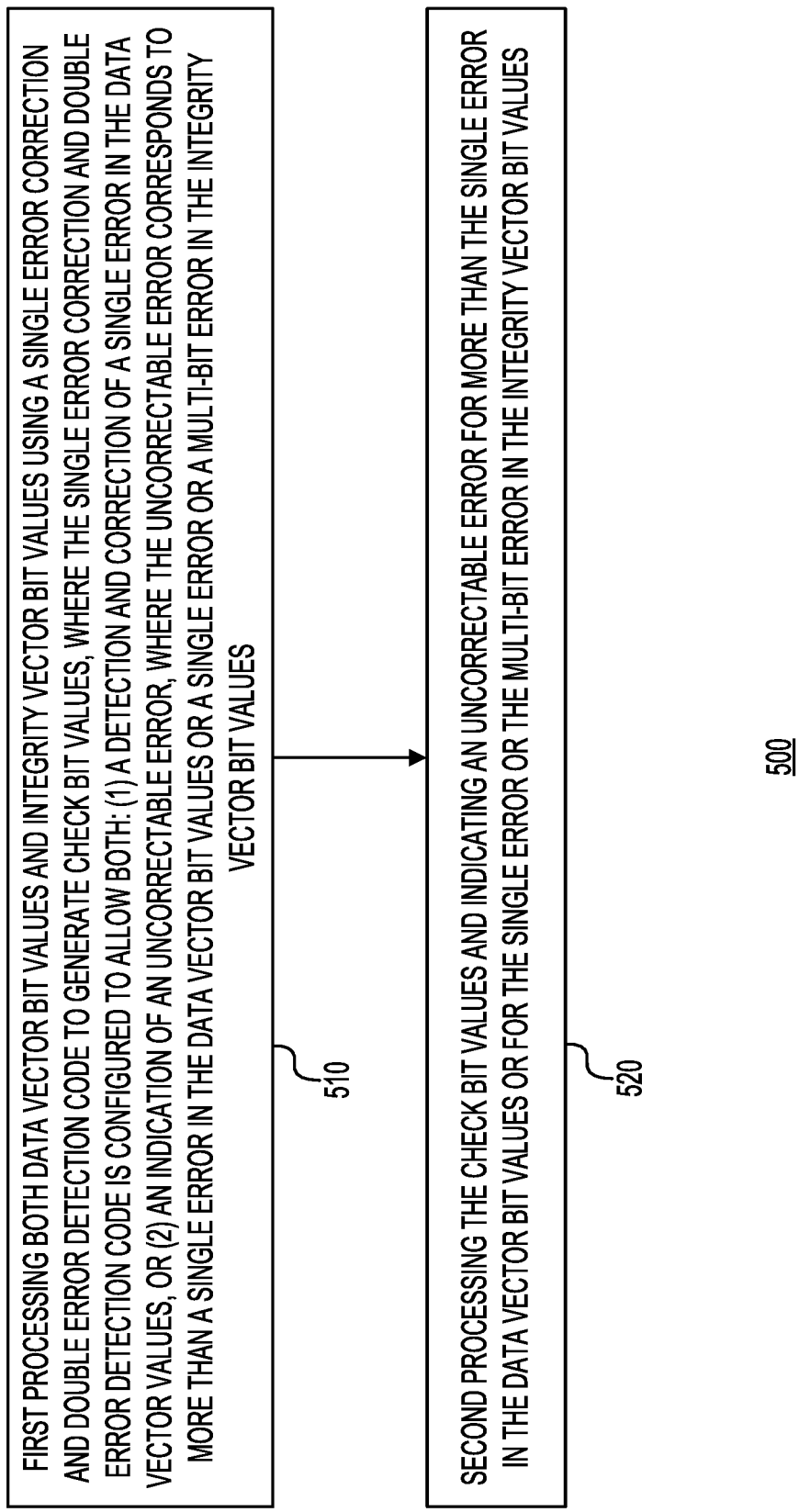
FIG. 5 shows a flow chart of a method for error correction and detection with integrity checking in accordance with one example.

FIG. 5 shows a flow chart 500 of a method for error correction and detection with integrity checking in accordance with one example. Step 510 may include first processing both data vector bit values and an integrity vector bit values using a single error correction and double error detection code to generate check bit values, where the single error correction and double error detection code is configured to allow both: (1) a detection and correction of a single error in the data vector values, or (2) an indication of an uncorrectable error, where the uncorrectable error corresponds to more than a single error in the data vector bit values or a single error or a multi-bit error in the integrity vector bit values. In this example, this step may be performed using encoder 300 as explained earlier with respect to FIG. 3.

Step 520 may include second processing the check bit values and indicating an uncorrectable error for more than a single error in the data vector bit values or for a single error or a multi-bit error in the integrity vector bit values. In this example, this step may be performed using the decoder described earlier with respect to FIGS. 4A and 4B. Although FIG. 5 describes a certain number of steps performed in a certain order, flow chart 500 may include additional steps and they need not be performed a particular order.

Figure 6:
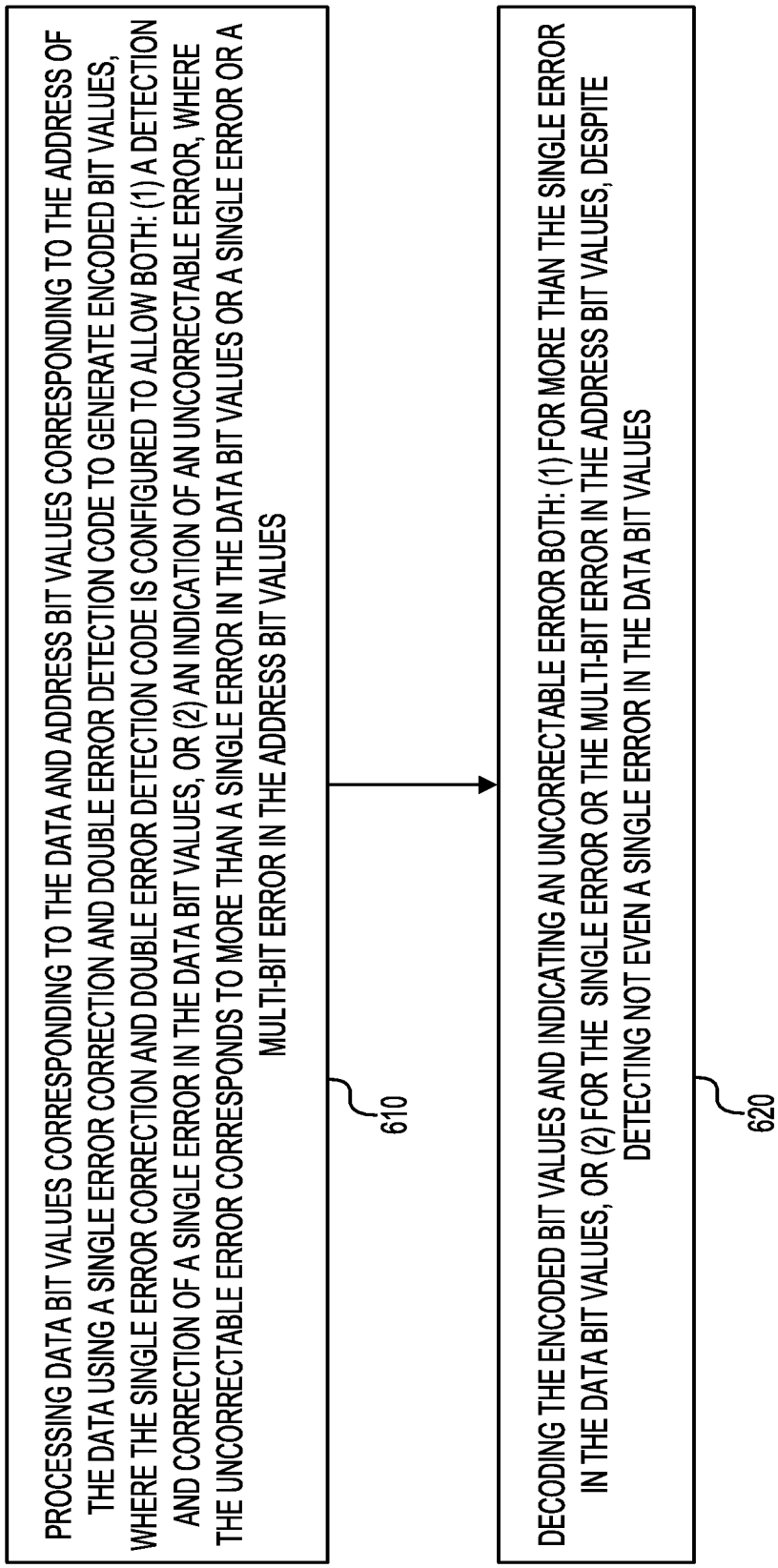
FIG. 6 shows another flow chart of a method for error correction and detection with integrity checking of the address bit values in accordance with one example.

FIG. 6 shows another flow chart 600 of a method in a system comprising a memory configured to store data at an address for error correction and detection with integrity checking of the address bit values in accordance with one example. Step 610 may include processing data bit values corresponding to the data and address bit values corresponding to the address of the data using a single error correction and double error detection code to generate encoded bit values, where the single error correction and double error detection code is configured to allow both: (1) a detection and correction of a single error in the data bit values, or (2) an indication of an uncorrectable error, where the uncorrectable error corresponds to for more than a single error in the data bit values or for a single error or a multi-bit error in the address bit values. In this example, this step may be performed using encoder 300 as explained earlier with respect to FIG. 3.

Step 620 may include decoding the encoded bit values and indicating an uncorrectable error both: (1) for more than the single error in the data bit values, or (2) for the single error or the multi-bit error in the address bit values, despite detecting not even a single error in the data bit values. In this example, this step may be performed using the decoder described earlier with respect to FIGS. 4A and 4B. Although FIG. 6 describes a certain number of steps performed in a certain order, flow chart 600 may include additional steps and they need not be performed a particular order.

In conclusion, the present disclosure relates to a method including first processing both data vector bit values and integrity vector bit values using a single error correction and double error detection code to generate check bit values, where the single error correction and double error detection code is configured to allow both: (1) a detection and correction of a single error in the data vector values, or (2) an indication of an uncorrectable error, where the uncorrectable error corresponds to more than a single error in the data vector bit values or a single error or a multi-bit error in the integrity vector bit values. The method may further include second processing the check bit values and indicating an uncorrectable error for more than a single error in the data vector bit values or for a single error or a multi-bit error in the integrity vector bit values.

The single error correction and double error detection code for the data bit values may have a Hamming weight of an odd number of check bits. The single error correction and double error detection code for the integrity vector bit values may have a Hamming weight of an even number of the check bits.

The integrity vector bit values may correspond to one of an address, a secure key, a secret key, a device identifier, a part identifier, a serial number, a code, analog trimming and calibration information, sensor trimming and calibration information, or any other meta-data. The first processing may comprise performing an exclusive OR operation on each subset of the data vector bit values and each subset of the integrity vector bit values for each bit position of the single error correction and double error detection code.

The second processing may comprise performing an exclusive OR operation on the check bit values and stored parity bit values retrieved from a memory. The memory may comprise one of a one-time programmable memory, static random access memory, or a dynamic random access memory.

In another example, the present disclosure relates to a system including an encoder configured to process both data bit values corresponding to data and address bit values corresponding to an address using a single error correction and double error detection code to generate check bit values, where the single error correction and double error detection code is configured to allow both: (1) a detection and correction of a single error in the data bit values, or (2) an indication of an uncorrectable error, where the uncorrectable error corresponds to more than a single error in the data bit values or a single error or a multi-bit error in the address bit values. The system may further include a decoder configured to process the check bit values and indicate an uncorrectable error both: (1) for more than a single error in the data bit values, or (2) for a single error or the multi-bit error in the address bit values, despite detecting not even a single error in the data bit values.

The single error correction and double error detection code for the data bit values may have a Hamming weight of an odd number of check bits. The single error correction and double error detection code for the integrity vector bit values may have a Hamming weight of an even number of the check bits.

The encoder may further be configured to perform an exclusive OR operation on each subset of the data bit values and each subset of the address bit values for each bit position of the single error correction and double error detection code. The decoder may further be configured to perform an exclusive OR operation on the check bit values and stored parity bit values retrieved from a memory. The memory may comprise one of a one-time programmable memory, static random access memory, or a dynamic random access memory.

In another example, the present disclosure relates to a method in a system comprising a memory configured to store data at an address. The method may include processing data bit values corresponding to the data and address bit values corresponding to the address of the data using a single error correction and double error detection code to generate encoded bit values, where the single error correction and double error detection code is configured to allow both: (1) a detection and correction of a single error in the data bit values, or (2) an indication of an uncorrectable error, where the uncorrectable error corresponds to more than a single error in the data bit values or a single error or a multi-bit error in the address bit values. The process may further include decoding the encoded bit values and indicating an uncorrectable error both: (1) for more than a single error in the data bit values, or (2) for a single error or a multi-bit error in the address bit values, despite detecting not even a single error in the data bit values.

The single error correction and double error detection code for the data bit values may have a Hamming weight of an odd number of check bits. The single error correction and double error detection code for the integrity vector bit values may have a Hamming weight of an even number of the check bits.

The encoding may comprise performing an exclusive OR operation on each subset of the data bit values and each subset of the address bit values for each bit position of the single error correction and double error detection code. The decoding may comprise performing an exclusive OR operation on each subset of the encoded bit values for each bit position of the single error correction and double error detection code and stored parity bit values retrieved from the memory. The memory may comprise one of a one-time programmable memory, static random access memory, or a dynamic random access memory.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method comprising:
   receiving data bit values, integrity vector bit values, and address bit values from a first logic block for writing the data bit values in a memory at a location based on the address bit values;
   encoding both the data bit values and the integrity vector bit values, but not the address bit values, using a single error correction and double error detection code to generate check bit values, wherein the single error correction and double error detection code is configured to allow both: (1) a detection and correction of a single error in the data bit values, or (2) an indication of an uncorrectable error, wherein the uncorrectable error corresponds to even a single error in the integrity vector bit values;
   storing the check bit values in the memory;
   receiving an address for reading the data bit values from a second logic block; and
   retrieving the check bit values from the memory, processing the check bit values, and indicating an uncorrectable error upon detecting even a single error in the integrity vector bit values.

2. The method of claim 1, wherein the single error correction and double error detection code for the data bit values has a Hamming weight of an odd number of check bits.

3. The method of claim 2, wherein the single error correction and double error detection code for the integrity vector bit values has a Hamming weight of an even number of the check bits.

4. The method of claim 1, wherein the integrity vector bit values correspond to one of a secure key, a secret key, a device identifier, a part identifier, a serial number, a code, analog trimming and calibration information, sensor trimming and calibration information, or any other meta-data.

5. The method of claim 1, wherein the encoding comprises performing an exclusive OR operation on each subset of the data bit values and each subset of the integrity vector bit values for each bit position of the single error correction and double error detection code.

6. The method of claim 1, wherein the processing the check bit values comprises performing an exclusive OR operation on the check bit values and stored parity bit values retrieved from the memory.

7. The method of claim 6, wherein the memory comprises one of a one-time programmable memory, static random access memory, or a dynamic random access memory.

8. The method of claim 1, further comprising the first logic block providing an error injection vector.

9. A system comprising:
   a logic block configured to provide data, integrity vector bit values, and an address for the data to be stored in a memory;
   an encoder configured to process both data bit values corresponding to the data and integrity vector bit values, but not address bit values corresponding to the address, using a single error correction and double error detection code to generate check bit values, wherein the single error correction and double error detection code is configured to allow both: (1) a detection and correction of a single error in the data bit values, or (2) an indication of an uncorrectable error, wherein the uncorrectable error corresponds to even a single error in the integrity vector bit values;
   the memory configured to store the check bit values; and
   a decoder configured to retrieve the check bit values from the memory, process the check bit values, and indicate an uncorrectable error upon detecting even a single error in the integrity vector bit values, despite detecting not even a single error in the data bit values.

10. The system of claim 9, wherein the single error correction and double error detection code for the data bit values has a Hamming weight of an odd number of check bits.

11. The system of claim 10, wherein the single error correction and double error detection code for the integrity vector bit values has a Hamming weight of an even number of check bits.

12. The system of claim 9, wherein the encoder is further configured to perform an exclusive OR operation on each subset of the data bit values and each subset of the integrity vector bit values for each bit position of the single error correction and double error detection code.

13. The system of claim 9, wherein the decoder is further configured to perform an exclusive OR operation on the check bit values and stored parity bit values retrieved from the memory.

14. The system of claim 13, wherein the memory comprises one of a one-time programmable memory, static random access memory, or a dynamic random access memory.

15. The system of claim 9, wherein the logic block is further configured to provide an error injection vector for testing and verification of the system.

16. A method comprising:
receiving data bit values corresponding to data for storage in a memory at an address for selecting a location in the memory;
processing the data bit values corresponding to the data and integrity vector bit values, but not address bit values corresponding to the address, using a single error correction and double error detection code to generate encoded bit values, wherein the single error correction and double error detection code is configured to allow both: (1) a detection and correction of a single error in the data bit values, or (2) an indication of an uncorrectable error, wherein the uncorrectable error corresponds to even a single error in the integrity vector bit values; and
decoding the encoded bit values and indicating an uncorrectable error for even a single error in the integrity vector bit values, despite detecting not even a single error in the data bit values.

17. The method of claim 16, wherein the single error correction and double error detection code for the data bit values has a Hamming weight of an odd number of check bits.

18. The method of claim 17, wherein the single error correction and double error detection code for the integrity vector bit values has a Hamming weight of an even number of check bits.

19. The method of claim 16, wherein the encoding comprises performing an exclusive OR operation on each subset of the data bit values and each subset of the integrity vector bit values for each bit position of the single error correction and double error detection code.

20. The method of claim 16, wherein the decoding comprises performing an exclusive OR operation on each subset of the encoded bit values for each bit position of the single error correction and double error detection code and stored parity bit values retrieved from the memory.

* * * * *